(12) United States Patent
Chua et al.

(10) Patent No.: US 12,205,789 B1
(45) Date of Patent: Jan. 21, 2025

(54) TRANSMISSION ELECTRON MICROSCOPY WITH SQUARE BEAMS

(71) Applicant: New York Structural Biology Center, New York, NY (US)

(72) Inventors: Eugene Yue Dao Chua, New York, NY (US); Lambertus Michael Alink, Plainview, NY (US)

(73) Assignee: New York Structural Biology Center, New York, NY (US)

( * ) Notice: Subject to any disclaimer, the term of this patent is extended or adjusted under 35 U.S.C. 154(b) by 0 days.

(21) Appl. No.: 18/395,805

(22) Filed: Dec. 26, 2023

Related U.S. Application Data

(60) Provisional application No. 63/528,366, filed on Jul. 22, 2023.

(51) Int. Cl.
*H01J 37/04* (2006.01)
*G01N 23/04* (2018.01)

(52) U.S. Cl.
CPC .............. *H01J 37/04* (2013.01); *G01N 23/04* (2013.01); *G01N 2223/612* (2013.01); *H01J 2237/0451* (2013.01)

(58) Field of Classification Search
CPC .. H01J 37/00; H01J 37/02; H01J 37/04; H01J 37/045; H01J 37/09; H01J 37/10; H01J 37/1474; H01J 2237/0451; G01N 23/04; G01N 2223/612
USPC .......................................... 250/306, 307, 311
See application file for complete search history.

(56) References Cited

U.S. PATENT DOCUMENTS

| | | | |
|---|---|---|---|
| 6,090,528 | A | 7/2000 | Gordon et al. |
| 6,700,642 | B2 | 3/2004 | Mori et al. |
| 9,564,291 | B1 * | 2/2017 | Own ........................ C23C 14/24 |
| 10,224,174 | B1 | 3/2019 | Freitag et al. |
| 11,183,364 | B1 | 11/2021 | Deng et al. |
| 2001/0045525 | A1 | 11/2001 | Gerlach et al. |
| 2004/0099636 | A1 | 5/2004 | Scipioni |
| 2006/0145097 | A1 | 7/2006 | Parker |
| 2007/0257207 | A1 * | 11/2007 | Frosien ................... H01J 37/09 250/492.3 |

(Continued)

FOREIGN PATENT DOCUMENTS

| | | |
|---|---|---|
| JP | 6971388 B2 | 11/2021 |
| WO | 2021196930 A1 | 10/2021 |

OTHER PUBLICATIONS

"Fringe-Free Imaging (FFI)," Data Sheet, ThermoFisher Scientific, 2019 https://assets.thermofisher.com/TFS-Assets/MSD/Datasheets/fringe-free-imaging-ds0317.pdf.

(Continued)

*Primary Examiner* — Jason L Mccormack
(74) *Attorney, Agent, or Firm* — David H. Judson

(57) ABSTRACT

An optical system of a Transmission Electron Microscope (TEM) is configured to use a square-shaped electron beam. Preferably, the square-shaped electron beam is produced by using an aperture with a square hole positioned in an aperture plane of TEM's beam shaping aperture (typically, the C2 lens). The square beam enables exhaustive tiling and data collection, enabling the complete imaging of large biological objects. In single particle analysis, a square beam also speeds up data collection rates. These improvements come with no significant loss in imaging quality compared to the standard round beam method of imaging.

13 Claims, 3 Drawing Sheets

(56) References Cited

U.S. PATENT DOCUMENTS

| | | |
|---|---|---|
| 2015/0371811 A1 | 12/2015 | Ogawa et al. |
| 2015/0371815 A1* | 12/2015 | Potocek ................ H01J 37/28 |
| | | 250/306 |
| 2019/0295814 A1 | 9/2019 | Franken et al. |
| 2021/0151286 A1* | 5/2021 | Iijima .................... H01J 37/28 |
| 2022/0399180 A1 | 12/2022 | Own |

OTHER PUBLICATIONS

ThermoFisher "Titan Condenser" Manual, Version 1.0, 2021 https://ia803404.us.archive.org/3/items/manualzilla-id-5895005/5895005.pdf.

Xu, et al., "Resolving hidden pixels beyond the resolution limit of projection imaging by square aperture," Scientific Reports vol. 13, Article No. 3449, Mar. 1, 2023 https://www.nature.com/articles/s41598-023-30516-z.

Laskin, et al., "Creating Round and Square Flattop Laser Spots in Microprocessing Systems With Scanning Optics," 2012, https://www.pishaper.com/pdfs/icaleo2012_creating_round_sq_flattop.pdf.

"Square Shape Bean Technology by FineMEC," 2019 https://www.finemecglobal.com/nobleen-1.

International Search Report and Written Opinion, PCT International Application No. PCT/US2024/038971, mailed Oct. 28, 2024.

Thermo Fisher Scientific, Inc. "Fringe-Free Imaging (FFI)", application note, 2020.

\* cited by examiner

TRANSMISSION ELECTRON MICROSCOPY WITH SQUARE BEAMS

BACKGROUND

Technical Field

This application relates generally to transmission electron microscopy (TEM).

Brief Description of the Related Art

Current transmission electron microscopes (such as a cryo-transmission electron microscope) use round electron beams to illuminate a specimen. Some specimens, e.g., biological specimens, are damaged by exposure to the electron beam, and so cannot be illuminated more than once. Further, round electron beams cannot be tiled perfectly, which results in regions of the specimen that must be illuminated multiple times, and therefore damaged, to image the entire specimen. Stated another way, and for specimens that are damaged by the electron beam during imaging, the inability to tile the beam means that the specimen can never be imaged exhaustively without either damaging parts of the specimen where the beams overlap or excluding parts of the specimen from imaging.

BRIEF SUMMARY

To address the above-described problems, a cryo-transmission electron microscope (cryo-TEM) is configured to use a square-shaped electron beam. Preferably, the square-shaped electron beam is produced by using an aperture with a square hole positioned in the back focal plane of TEM's C2 lens and, in particular, in a C2 aperture plane below the TEM's C2 lens; an aperture located at this position typically is the beam shaping aperture. The square beam enables exhaustive tiling and data collection, enabling the complete imaging of large biological objects. In single particle analysis, which is currently the most prevalent application of cryo-TEM for biological imaging, exhaustive tiling with a square beam also speeds up data collection rates. These improvements come with no significant loss in imaging quality compared to the standard round beam method of imaging.

In one embodiment, a square electron beam is provided in a transmission electron microscope (TEM). The square beam is formed by placing a square aperture in the C2 aperture plane below the C2 lens, and its key advantage is that a square beam can be tiled to exhaustively image a specimen. Preferably, the TEM also is configured in a fringe-free imaging (FFI) setup, wherein an objective lens and specimen stage of the TEM are adjusted such that the C2 aperture is imaged in focus by an upper objective pole piece (namely, the upper portion of the objective lens), thereby eliminating Fresnel fringes from a beam edge; this increases the beam's useful area. When the square aperture is placed into a TEM with fringe-free imaging, the square beam is condensed to the size of the microscope's camera, then tiled to exhaustively image the specimen. This enables the exhaustive imaging of large specimens, e.g. cellular organelles, providing complete insight into biological processes. To maximize imaging efficiency, and in addition to using a square aperture to generate the square beam in a fringe-free TEM, preferably the square beam is rotated so that it falls square onto the microscope camera; this enables the entirety of the sample exposed to the beam to be captured by the camera. This is accomplished in practice by adjusting the current in a projection (P2) lens.

A preferred embodiment for the square beam replaces the circular C2 aperture with an aperture with a square hole size of between approximately 50-100 μm in length.

The foregoing has outlined some of the more pertinent features of the disclosed subject matter. These features should be construed to be merely illustrative. Many other beneficial results can be attained by applying the disclosed subject matter in a different manner or by modifying the subject matter as will be described.

BRIEF DESCRIPTION OF THE DRAWINGS

For a more complete understanding of the subject matter and the advantages thereof, reference is now made to the following descriptions taken in conjunction with the accompanying drawings, in which.

DETAILED DESCRIPTION

Figure 1:
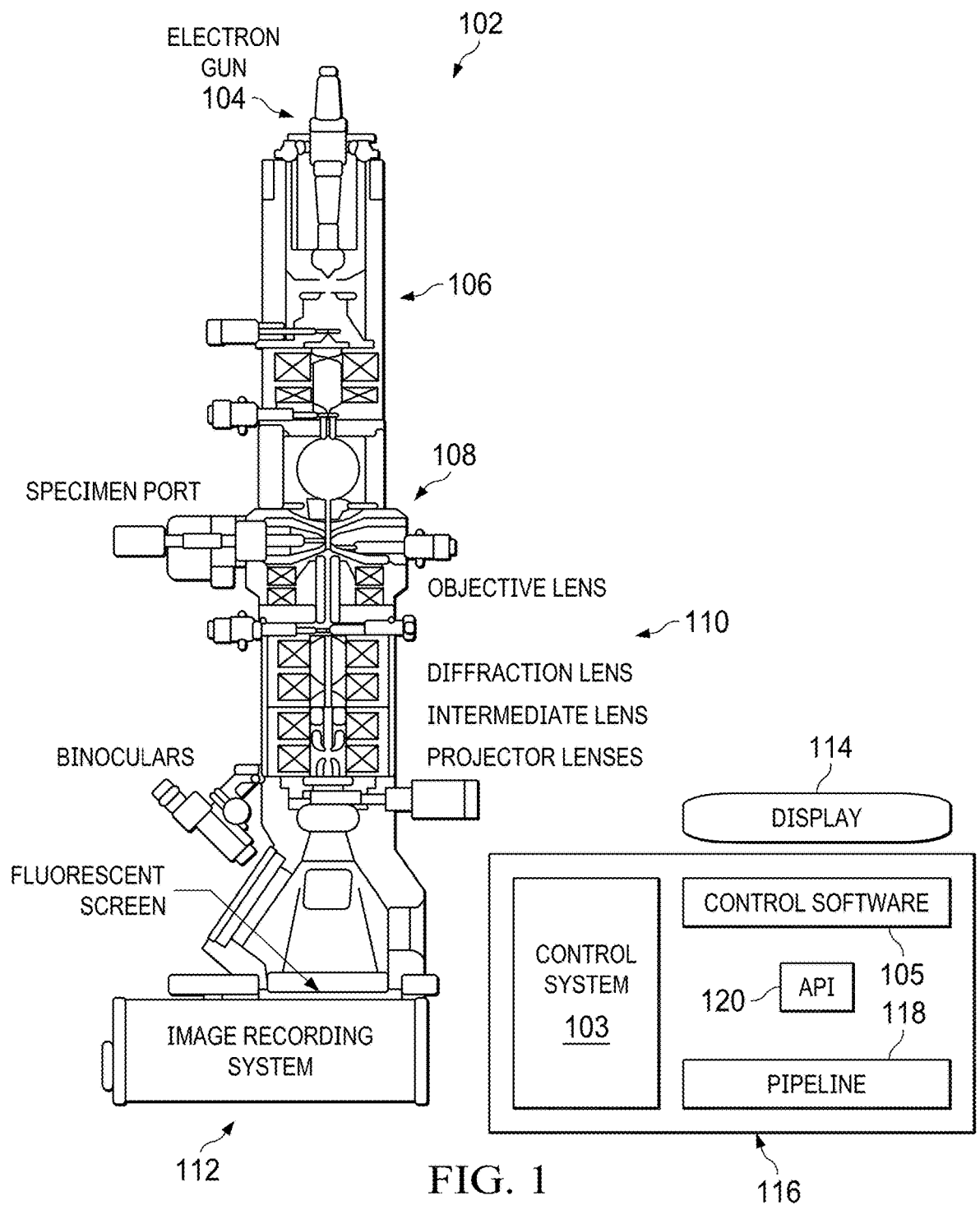
FIG. 1 is a high-level depiction of a cryo-EM system in which the techniques of this disclosure may be practiced.

The techniques herein typically are implemented in association with a cryo-EM system. FIG. 1 depicts a representative cryo-EM system 100 in which the techniques of this disclosure are practiced. The system comprises a transmission electron microscope 102, and an associated control system 103 configured to control the position of the microscope 102 relative to a target being examined. Control system 103 includes microscope control software 105, such as Leginon (Simons Electron Microscopy Center, New York Structural Biology Center), SerialEM (University of Colorado Boulder), Thermo-Fisher® EPU, and the like. For imaging, microscope 102 comprises an electron source 104 that emits a beam of electrons, an electromagnetic lens system 106 that focuses the beam of electrons down to a nanometer scale, a sample holder 108 that holds a sample to be observed (e.g., within a stage), a series of electromagnetic lenses 110 that transmit the electrons through the sample, a series of detectors 112 that are configured to detect the electrons as they are transmitted through the sample, a display 114 configured to display an image of the sample based on the detected electrons, and a computing system 116 (including microscope control software 105) configured to control the operation of the electron source, the electromagnetic lenses, the detectors, and the display. The system may also include a software-based pipeline 118 that uses neural network models and computer vision algorithms to navigate cryo-EM grids at low- and medium-magnification to determine high-quality targeting locations for the microscope, preferably without human input. The models may comprise both pre-trained neural network models, together with models that provide learning on-the-fly during an active data collection. In this example, the software pipeline 118 is supported in a data store or memory of the computing system 116 and interoperates with the microscope control software 105 over an Application Programming Interface (API) 120. In an alternative, the software pipeline 118 is integrated directly into the microscope control software 105 in the computing system.

Figure 2:
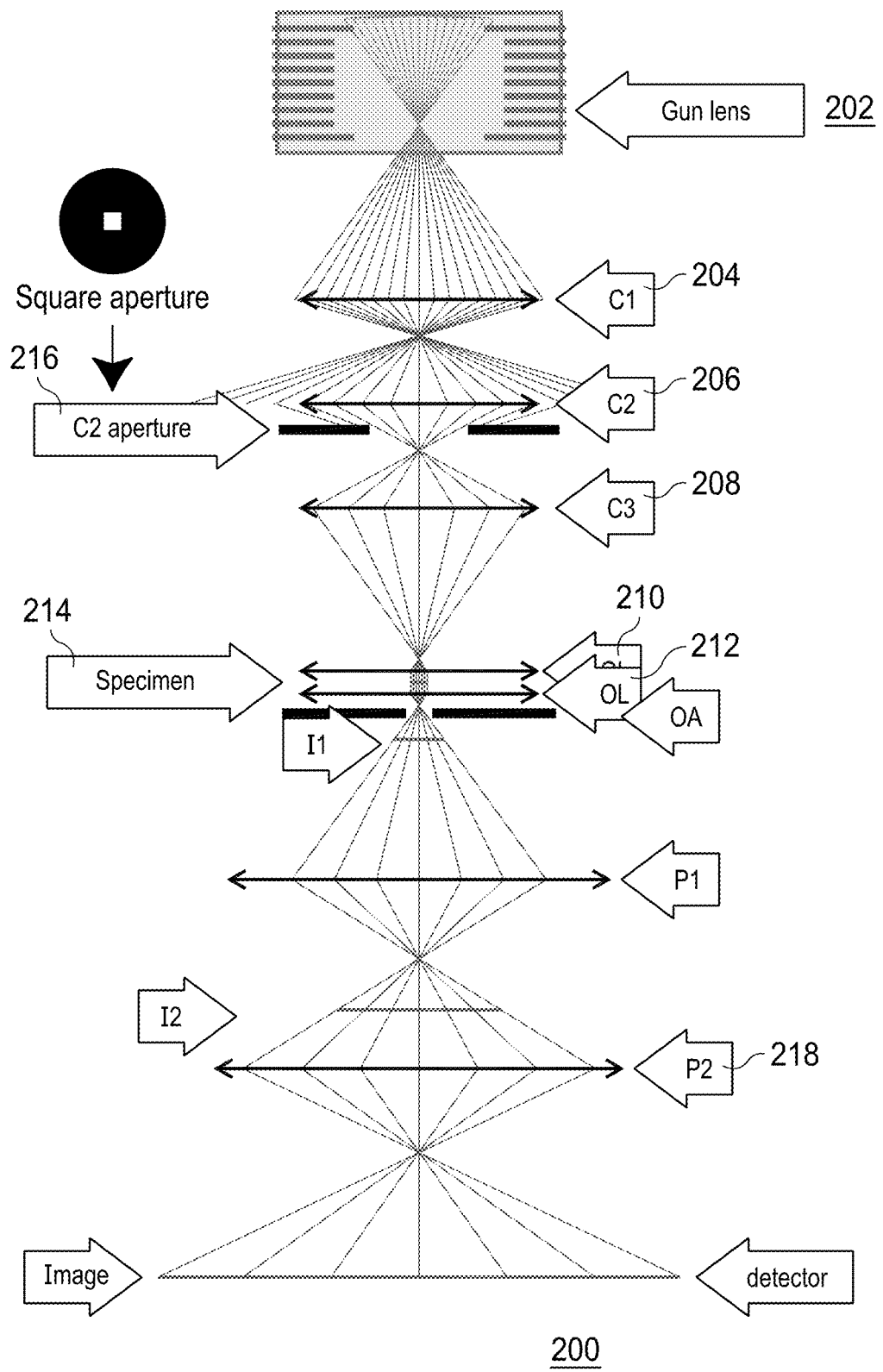
FIG. 2 depicts a portion of an optical system of a TEM, such as the cryo-TEM shown in FIG. 1.

FIG. 2 depicts a portion of the optics of a representative TEM from the gun lens to the objective lens, such as for the microscope shown in FIG. 1. As depicted, the microscope 200 has six (6) lenses in its illuminating system, namely, a gun lens 202, a first condenser lens (C1) 204, a second condenser lens (C2) 206, a third condenser lens (C3) 208, a minicondenser lens (MC) (not shown), and an upper and lower objective lens 210 and 212. The C2 aperture is the beam shaping aperture. The drawing also depicts a ray diagram of the electrons passing through the column of the TEM. This is the TEM mode of illumination. In this mode, theoretically the beam on the specimen 214 is parallel and the C3 lens images the source on the front focal plane of the upper objective lens. In a typical optical alignment of this type, it is known that the C2 aperture of the microscope induces Fresnel fringes at the edge of the beam that illuminates the specimen. These fringes can cause artifacts and unusable areas for data collection. To address this, it is also known to provide so-called Fringe-Free Imaging (FFI) to configure the objective lens and the mechanical height of the sample stage such that the C2 aperture is imaged in focus at the specimen plane and the fringes are almost completely eliminated.

Figure 3:
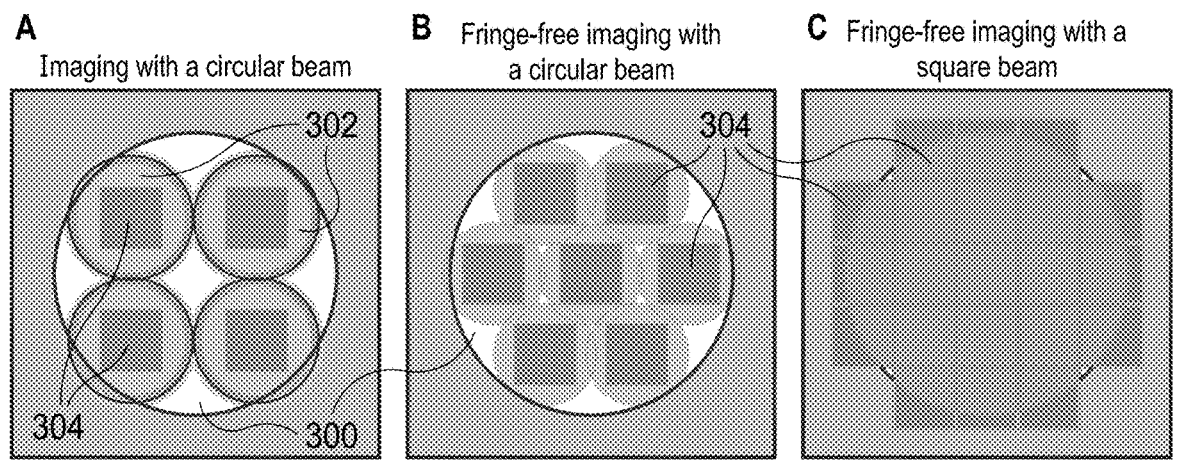
FIG. 3 depicts imaging examples showing (A) imaging with a circular beam without FFI; (B) imaging with a circular beam with FFI; and (C) imaging with a square beam and FFI according to a preferred embodiment herein.

In the prior art, the optical system depicted in FIG. 2 uses a circular beam. According to this disclosure, and in contrast to this known approach, the hole in the C2 aperture 216 is square (as opposed to circular), which produces a square beam. This beam configuration provides significant advantages, e.g., as depicted in the imaging examples with different beam setups as shown in FIG. 3. The first drawing (A) depicts the conventional approach (circular beam, without FFI) showing the specimen 300, the circular areas 302 illuminated by the electron beam, and the areas 304 captured by the microscope camera (which typically are squares due to the physical characteristics of the camera). The second drawing (B) is also a conventional approach (the circular beam), but in this case using FFI, which allows for better tiling of the beam on the sample as compared to the first use case (A). The third drawing (C) depicts the imaging of the specimen using the approach of this disclosure, wherein a square beam is used, preferably with FFI. The square beam is formed by configuring the C2 aperture as square. As can be seen, by placing the square aperture at the C2 aperture position and using FFI, the beam can be tiled and virtually all of the specimen is accounted for without excess damage and without excluding any portions of the specimen from the imaging.

Figure 4:
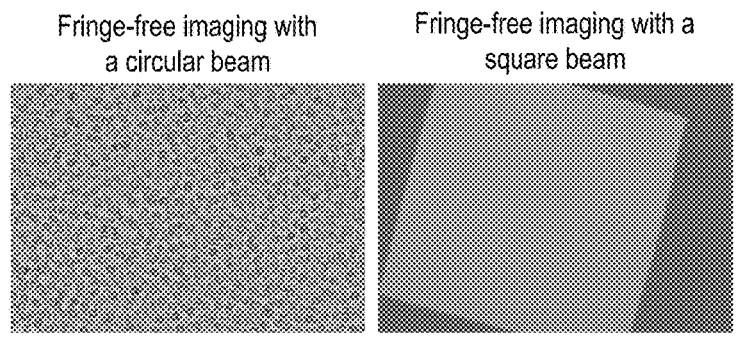
FIG. 4 depicts (A) an image of a biological specimen captured using the prior art, and (B) and (C) the image captured using the techniques of this disclosure.

FIG. 4 depicts images of a biological specimen captured by the camera illuminated with either a circular beam (the prior art) or a square beam (according to this disclosure). Preferably, and as reflected in the right side drawing, the square beam has the exact size of the shortest dimension of the camera, and it is rotated such that it is square onto the camera. The size of the square beam is adjusted by changing the beam intensity. As noted above, to accomplish the rotation of the beam (to be square onto the camera) may be accomplished by adjusting a current in the projection lens (P2) 218 in the microscope. Adjusting the current in the P2 lens has the side effect of changing the magnification, rotation, and defocus of the image (which in turn requires re-calibrating pixel size, image shift matrices, and eucentric focus). In an alternative embodiment, a physical rotation of the square aperture itself is done. To this end, a worm wheel gear is installed through the (hollow) aperture stick of the microscope to rotate the square aperture while it is in the liner tube under vacuum (during illumination). This allows alignment of the square beam to the camera during normal cryo-EM operation.

A square beam has significant advantages in that it can be tiled to maximize the area imaged by the TEM. This is highly advantageous in many applications but especially in montage cryo-electron tomography for exhaustively imaging large biological specimens. The system includes control software such as PACEtomo (University of Tokyo, Japan) and SerialEM (available from University of Colorado Boulder) that are configured to tile (preferably, in a perfect manner) the square beam during imaging. In particular, and in one example embodiment (with PACEtomo and SerialEM together), the microscope is controlled such that the electron beam is shifted by beam-image shift in a manner that tiles the beam onto the sample with minimal overlap, such that a large area of sample is imaged or montaged. The stage can then be tilted with PACEtomo and SerialEM to collect tomograms of the sample for montage tomography.

Figure 5:
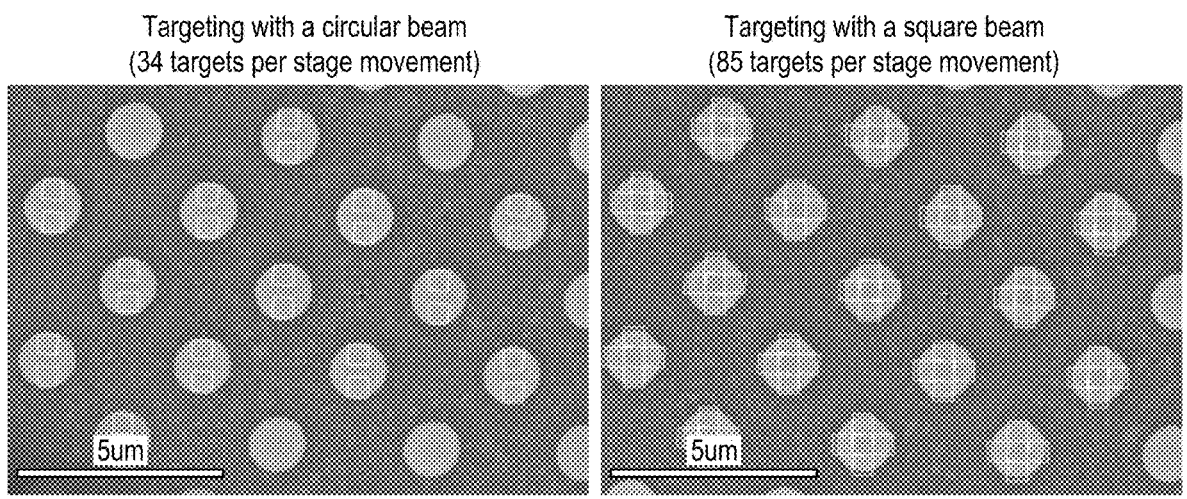
FIG. 5 depicts (A) targeting with a circular beam (as in the prior art) versus (B) targeting with a square beam according to this disclosure.

In single particle analysis, a key application of biological cryo-TEM, using a square beam as described herein dramatically increases throughput. This is depicted in FIG. 5. In particular, the left image shows the specimen targeted using a circular beam (as in the prior art) as compared to the right image, which shows the same specimen targeted using the square beam (as provided in this disclosure). The white squares depicted in the image represent the area of the specimen that is imaged by the camera. In this example, using a fringe-free circular beam (on the left) allows for up to 34 targets (i.e., 17×2) per stage movement with a round beam, but up to 85 (i.e., 17×5) targets with the square beam). This method of data collection for single particle analysis can be achieved with microscope control software such as SerialEM, Leginon (New York Structural Biology Center), EPU (ThermoFisher Scientific), or the like. There is no significant loss in imaging quality compared to the standard round beam method of imaging. Single particle analysis reconstructions of apoferritin (a biological test sample) images taken with the square beam achieve almost the same resolution as images taken with the round beam, with a marginal loss of resolution of only ~0.1 Å. Experimental results also confirmed that correction of coma aberrations with the square beam can achieve the same degree of coma (<150 nm) as a circular beam.

Variants

The technique herein may be expanded to include other non-circular-shaped beams, such as hexagons, octagons, and the like. Further, other microscopy techniques that suffer from radiation damage to the sample during imaging can benefit by applying the techniques herein to improve their imaging setup.

What we claim is as follows.

The invention claimed is:

1. A method of illuminating a sample in a Transmission Electron Microscope (TEM), the TEM having an illumination system comprising a set of optical lenses arranged in a column, and a camera, comprising:
   configuring the illumination system with a non-circular beam shaping aperture;
   during an illumination mode, illuminating a specimen using a non-circular shaped beam formed by the non-circular beam shaping aperture; and tiling the non-circular shaped beam to maximize an area of the specimen imaged by the TEM;
wherein the non-circular beam is rotated with respect to an orientation of the camera.

2. The method as described in claim 1 wherein the non-circular beam shaping aperture and the non-circular shaped beam are square.

3. The method as described in claim 2 further including applying fringe-free imaging while illuminating the specimen using the square beam.

4. A method of illuminating a sample in a Transmission Electron Microscope (TEM), the TEM having an illumination system comprising a set of optical lenses arranged in a column, and a camera, comprising:
configuring the illumination system with a non-circular beam shaping aperture;
during an illumination mode, illuminating a specimen using a non-circular shaped beam formed by the non-circular beam shaping aperture;
tiling the non-circular shaped beam to maximize an area of the specimen imaged by the TEM;
wherein the non-circular beam shaping aperture and the non-circular shaped beam are square;
applying fringe-free imaging while illuminating the specimen using the square beam; and
wherein the square beam is condensed to the size of the camera.

5. The method as described in claim 1 wherein rotation of the non-circular beam with respect to the orientation of the camera is achieved by adjusting a current in a projection lens of the TEM.

6. The method as described in claim 1 wherein the non-circular beam shaping aperture is located at an aperture plane of a C2 lens in the set of optical lenses.

7. The method as described in claim 1 wherein the TEM is a cryo-TEM.

8. The method as described in claim 1 wherein the specimen is a biological specimen.

9. A Transmission Electron Microscope (TEM), comprising:
an electron source;
an illumination system comprising a set of optical lenses arranged in a column, and
a camera, the illumination system including a non-circular shaped beam shaping aperture; and
a control system comprising hardware and software, the software configured to control the electron source and the illumination system to illuminate a specimen with a non-circular shaped beam, to rotate the non-circular shaped beam to be square onto the camera, and to tile the non-circular shaped beam across the specimen.

10. A method operating in a cryo-transmission electron microscope having a camera, comprising:
illuminating a biological sample using a square shape beam and a fringe-free imaging setup; and
as the biological sample is illuminated, rotating the square shape beam to be square onto the camera.

11. The TEM as described in claim 9 wherein the software is further configured to condense the non-circular shaped beam to a size of the camera.

12. The TEM as described in claim 9 wherein the non-circular shaped beam shaping aperture and the non-circular shaped beam are square.

13. The method as described in claim 10 further including condensing the square shape beam to a size of the camera.

* * * * *